(12) United States Patent
Rand et al.

(10) Patent No.: US 7,230,269 B2
(45) Date of Patent: Jun. 12, 2007

(54) ORGANIC PHOTOSENSITIVE CELLS HAVING A RECIPROCAL-CARRIER EXCITON BLOCKING LAYER

(75) Inventors: Barry P. Rand, Princeton, NJ (US); Stephen R. Forrest, Princeton, NJ (US); Mark E. Thompson, Anaheim Hills, CA (US)

(73) Assignees: The Trustees of Princeton University, Princeton, NJ (US); The University of Southern California, Los Angeles, CA (US)

( * ) Notice: Subject to any disclaimer, the term of this patent is extended or adjusted under 35 U.S.C. 154(b) by 142 days.

(21) Appl. No.: 11/150,143

(22) Filed: Jun. 13, 2005

(65) Prior Publication Data

US 2006/0278944 A1    Dec. 14, 2006

(51) Int. Cl.
*H01L 29/08* (2006.01)
*H01L 21/00* (2006.01)
*H01L 51/40* (2006.01)

(52) U.S. Cl. ............... 257/40; 438/82; 438/99; 313/504; 428/690

(58) Field of Classification Search ............ 438/82, 438/89; 257/40; 313/504, 506; 428/690, 428/917
See application file for complete search history.

(56) References Cited

U.S. PATENT DOCUMENTS

2002/0189666 A1    12/2002    Forrest et al.

2005/0061364 A1*   3/2005    Peumans et al. ............ 136/263

FOREIGN PATENT DOCUMENTS

WO    WO 01/39276    5/2001

OTHER PUBLICATIONS

Peumans et al., "Very-high-efficiency double-heterostructure copper phthalocyanine/$C_{60}$ photovoltaic cells", Appl. Phys. Lett. 79(1): 126-128, Jul. 2, 2001.
Kim et al., "Organic solar cell devices based on PVK/porphyrin system", Synthetic Metals 117: 289-291, 2001.
Suemori et al., "Organic solar cells protected by very thick naphthalene tetracarboxylic anhydride films", Appl. Phys. Lett. 85(25): 6269-6271, Dec. 20, 2004.
Rand et al., "Organic double-heterostructure photovoltaic cells employing thick tris(acetylacetonato)ruthenium(III) exciton-blocking layers", Advanced Materials 17: 2714-2718, 2005.
International Search Report dated Nov. 24, 2006, Application No. PCT/US2006/021374 filed Jun. 1, 2006.

* cited by examiner

*Primary Examiner*—Hsien-Ming Lee
(74) *Attorney, Agent, or Firm*—Kenyon & Kenyon LLP

(57) ABSTRACT

A photosensitive cell includes an anode and a cathode; a donor-type organic material and an acceptor-type organic material forming a donor-acceptor junction connected between the anode and the cathode; and an exciton blocking layer connected between the acceptor-type organic material of the donor-acceptor junction and the cathode, the blocking layer consisting essentially of a material that has a hole mobility of at least $10^{-7}$ cm$^2$/V-sec or higher, where a HOMO of the blocking layer is higher than or equal to a HOMO of the acceptor-type material.

17 Claims, 12 Drawing Sheets

ORGANIC PHOTOSENSITIVE CELLS HAVING A RECIPROCAL-CARRIER EXCITON BLOCKING LAYER

UNITED STATES GOVERNMENT RIGHTS

This invention was made with U.S. Government support under Contract No. 339-4012 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, the Universal Display Corporation, and the Global Photonics Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having an exciton blocking layer employing reciprocal carrier transport, transporting holes disassociated at the cathode to the acceptor material.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The term "photoconductive material" is used herein to refer to semiconductor materials which are chosen for their property of absorbing electromagnetic radiation to generate electric charge carriers, and may be used to refer to such semiconductor materials in all types of photosensitive devices, including photovoltaic devices, photoconductor devices, and photodetectors.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff=\{I_{max}V_{max}\}/\{I_{SC}V_{OC}\}$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device; the power efficiency of the device, $\eta_p$, may be calculated by:

$$\eta_p = ff*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Psi S_0^*$. Here $S_0$ and $S_0^*$ denote ground and excited molecular states, respectively; h is the Planck constant; v is the frequency of the photon; and $\Psi$ is a state function. This energy absorption is associated with the promotion of an electron from a bound state in the HOMO energy level, which may be a B-bond, to the LUMO energy level, which may be a B*-bond, or equivalently, the promotion of a hole from the LUMO energy level to the HOMO energy level. In organic thin-film photoconductive materials, the generated molecular state is generally believed to be an exciton, i.e., an electron-hole pair in a bound state which is transported as a quasi-particle. The excitons can have an appreciable lifetime before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy, level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang, *Applied Physics Letters* 48, 183 (1986), contain a heterojunction analogous to that employed in a conventional inorganic PV cell. However, it is now recognized that in addition to the establishment of a p-n type junction, the energy level offset of the heterojunction may also play a role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, some organic PV devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for exciton diffusion, CC for charge collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50 Å$) than the optical absorption length (~500Å), requiring a trade off between using a thick, and therefore resistive, cell with multiple or highly folded interfaces, or a thin cell with a low optical absorption efficiency.

Typically, when light is absorbed to form an exciton in an organic thin film, a singlet exciton is formed. By the mechanism of intersystem crossing, the singlet exciton may decay to a triplet exciton. In this process energy is lost which will result in a lower efficiency for the device. If not for the energy loss from intersystem crossing, it would be desirable to use materials that generate triplet excitons, as triplet excitons generally have a longer lifetime, and therefore a longer diffusion length, than do singlet excitons.

SUMMARY OF THE INVENTION

Embodiments of the present invention employ a reciprocal-carrier exciton blocking layer, transporting holes from the cathode to the acceptor. A photosensitive cell comprises an anode and a cathode; a donor-type organic material and an acceptor-type organic material forming a donor-acceptor junction connected between the anode and the cathode; and an exciton blocking layer connected between the acceptor-type organic material of the donor-acceptor junction and the cathode, the blocking layer consisting essentially of a material that has a hole mobility of at least $10^{-7}$ cm$^2$/V-sec or higher, wherein a HOMO of the blocking layer is higher than or equal to a HOMO of the acceptor-type material. More preferably, the material has the hole mobility of at least $10^{-6}$ cm$^2$/V-sec or higher.

To assure good hole injection, a Fermi level of the cathode is preferably no more than 1 eV higher than the HOMO of the exciton blocking layer. To minimize recombination losses, a HOMO of the exciton blocking layer is preferably no more than 1 eV below the LUMO of the acceptor. An example material for the exciton blocking layer is tris (acetylacetonato) ruthenium(III).

BRIEF DESCRIPTION OF THE DRAWINGS

In the drawings, holes are shown as open circles and electrons as filled circles.

DETAILED DESCRIPTION

An organic photosensitive optoelectronic device is provided. Organic devices of embodiments of the present invention may be used, for example, to generate a usable electrical current from incident electromagnetic radiation (e.g., PV devices) or may be used to detect incident electromagnetic radiation. Embodiments of the present invention may comprise an anode, a cathode, and a photoactive region between the anode and the cathode. The photoactive region is the portion of the photosensitive device that absorbs electromagnetic radiation to generate excitons that may dissociate in order to generate an electrical current. Organic photosensitive optoelectronic devices may also include at least one transparent electrode to allow incident radiation to be absorbed by the device. Several PV device materials and configurations are described in U.S. Pat. No. 6,657,378 to Forrest et al., U.S. Pat. No. 6,580,027 to Forrest et al., and U.S. Pat. No. 6,352,777 to Bulovic et al., which are incorporated herein by reference for their disclosure of PV device materials and configurations.

Figure 1:
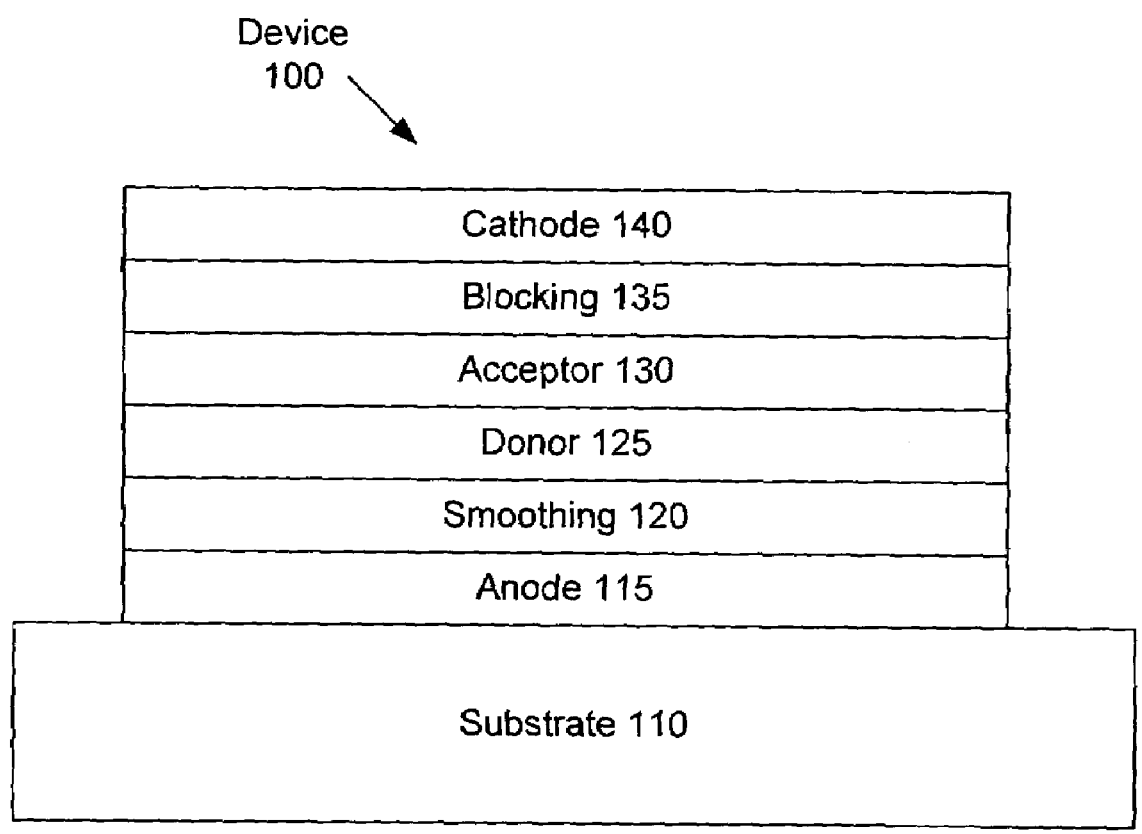
FIG. 1 shows an organic PV device comprising an anode, an anode smoothing layer, a donor layer, an acceptor layer, a blocking layer, and a cathode.

FIG. 1 shows an organic photosensitive optoelectronic device 100. The figures are not necessarily drawn to scale. Device 100 may include a substrate 110, an anode 115, an anode smoothing layer 120, a donor layer 125, an acceptor layer 130, a blocking layer 135, and a cathode 140. Cathode 140 may be a compound cathode having a first conductive layer and a second conductive layer. Device 100 may be fabricated by depositing the layers described, in order. Charge separation may occur predominantly at the organic heterojunction between donor layer 125 and acceptor layer 130. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface.

The specific arrangement of layers illustrated in FIG. 1 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used.

The substrate 110 may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

U.S. Pat. No. 6,352,777 to Bulovic et al. provides examples of electrodes, or contacts, that may be used in a photosensitive optoelectronic device, which are incorporated herein by reference. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of theambient electromagnetic radiation in relevant wavelengths to be transmitted through the layer or layers. Similarly, layers which permit some, but less that 50% transmission of ambient electromagnetic radiation in relevant wavelengths are said to be "semi-transparent."

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

The organic photosensitive optoelectronic device 100 may include, as one or more of the transparent electrodes of the photosensitive optoelectronic device, a highly transparent, non-metallic, low resistance cathode such as disclosed in U.S. Pat. No. 6,420,031, to Parthasarathy et al., or a highly efficient, low resistance metallic/non-metallic compound cathode such as disclosed in U.S. Pat. No. 5,703,436 to Forrest et al., both incorporated herein by reference in their entirety. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode.

Herein, the term "cathode" is used in the following manner. In a non-stacked PV device or a single unit of a stacked PV device under ambient irradiation and connected with a resistive load and with no externally applied voltage, e.g., a PV device, electrons move to the cathode from the photoconductive material. Similarly, the term "anode" is used herein such that in a PV device under illumination, holes move to the anode from the photoconductive material, which is equivalent to electrons moving in the opposite manner. It will be noted that as the terms are used herein, anodes and cathodes may be electrodes or charge transfer layers.

An organic photosensitive device will comprise at least one photoactive region in which light is absorbed to form an excited state, or "exciton", which may subsequently dissociate in to an electron and a hole. The dissociation of the exciton will typically occur at the heterojunction formed by the juxtaposition of an acceptor layer and a donor layer. For example, in the device of FIG. 1, the "photoactive region" may include donor layer 125 and acceptor layer 130.

The acceptor material may be comprised of, for example, perylenes, naphthalenes, fullerenes or nanotubules. An example of an acceptor material is 3,4,9,10-perylenetetracarboxylic bis-benzimidazole (PTCBI). Alternatively, the acceptor layer may be comprised of ha fullerene material as described in U.S. Pat. No. 6,580,027, incorporated herein by reference in its entirety. Adjacent to the acceptor layer, is a layer of organic donor-type material. The boundary of the acceptor layer and the donor layer forms the heterojunction which may produce an internally generated electric field. The material for the donor layer may be a pthalocyanine or a porphyrin, or a derivative or transition metal complex thereof, such as copper pthalocyanine (CuPc). Other suitable acceptor and donor materials may be used.

Through the use of an organometallic material in the photoactive region, devices incorporating such materials may efficiently utilize triplet excitons. It is believed that the singlet-triplet mixing may be so strong for organometallic compounds, that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

The stacked organic layers may include one or more exciton blocking layers (EBLs). For example, exciton blocking layers are described in U.S. Pat. No. 6,097,147 to Baldo et al.; Peumans et al, *Applied Physics Letters* 76, 2650–52 (2000); and U.S. Pat. No. 6,451,415 to Forrest et al., each of which are incorporated herein by reference for their background description of the art. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is generally believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier.

By design, an EBL will exist between two other layers, usually an organic photosensitive semiconductor layer and a electrode or charge transfer layer. The adjacent electrode or charge transfer layer will be incontext either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. Prior to new discoveries described below, it was conventionally believed to be desirable for a material used as a cathode side EBL to have a LUMO energy level closely matching the LUMO energy level of the adjacent ETL material so that any undesired barrier to electrons would be minimized. See, for example, U.S. Published Patent Application No. 2004-0067324 A1, published Apr. 8, 2004 to Lazarev et al.

It should be appreciated that the exciton blocking nature of a material is not an intrinsic property of its HOMO-LUMO energy gap. Whether a given material will act as an exciton blocker depends upon the relative HOMO and LUMO energy levels of the adjacent organic photosensitive material, as well upon the carrier mobility and carrier conductivity of the material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

An EBL 135 may be situated between the acceptor layer and the cathode. Examples of a EBL materials known in the art include 2,9-dimethyl-4,7-diphenyl-1,10-phenanthroline (also called bathocuproine or BCP), which is believed to have a LUMO-HOMO energy level separation of about 3.5 eV, or bis(2-methyl-8-hydroxyquinolinoato)-aluminum(III) phenolate ($Alq_2OPH$). Prior to the discoveries described below, BCP was believed to transport electrons to the cathode from an acceptor layer.

The EBL layer 135 may be doped with a suitable dopant. Example dopants, although not necessarily dopants consistent with the charge transport characteristics of the present invention, include but are not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA) and derivatives thereof.

EBL materials, when deposited, may be amorphous. Such amorphous exciton blocking layers may exhibit film recrystallization, which may be especially rapid under high light intensities. The resulting morphology change to polycrystalline material can result in a lower quality film with possible defects such as shorts, voids or intrusion of electrode material. Accordingly, it has been found that doping of some EBL materials that exhibit this effect with a suitable, relatively large and stable molecule can stabilize the EBL structure to prevent performance degrading morphology changes. It should be further appreciated that doping of an EBL which is transporting electrons in a given device with a material having a LUMO energy level close to that of the EBL will help insure that electron traps are not formed which might produce space charge build-up and reduce performance. Likewise, it should be appreciated that doping an EBL which is transporting holes in a given device with a material having a HOMO energy level close to that of the EBL will help insure that hole traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

An organic photosensitive optoelectronic device 100 may also comprise transparent charge transfer layers or charge recombination layers. As described herein charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer does not have an electrical connection external to the device and only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticle or nanorods as described in U.S. Pat. No. 6,657,378 to Forrest et al., incorporated herein for its disclosure of charge recombination layer structures and materials.

An anode-smoothing layer 120 may be situated between the anode and the donor layer. A preferred material for this layer comprises a film of 3,4-polyethylenedioxythiophene: polystyrenesulfonate (PEDOT:PSS). The introduction of the PEDOT:PSS layer between the anode (ITO) and the donor layer may lead to greatly improved fabrication yields. This is attributed to the ability of the spin-coated PEDOT:PSS film to planarize the ITO, whose rough surface could otherwise result in shorts through the thin molecular layers.

One or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The simple layered structure illustrated in FIG. 1 is provided by way of non-limiting example, and it is understood that embodiments of the invention may be used in connection with a wide variety of other structures. The specific materials and structures described are exemplary in nature, and other materials and structures may be used. Functional devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

Organic materials for use in the photoactive layers of a photosensitive device may include cyclometallated organometallic compounds. The term "organometallic" as used herein is as generally understood by one of ordinary skill in the art and as given, for example, in "Inorganic Chemistry" (2nd Edition). by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO. The term cyclometallated refers to compounds that comprise an bidentate organometallic ligand so that, upon bonding to a metal, a ring structure is formed that includes the metal as one of the ring members.

Organic layers may be fabricated using vacuum deposition, spin coating, organic vapor-phase deposition, inkjet printing and other methods known in the art.

Organic photosensitive optoelectronic devices of embodiments of the present invention may function as a photovoltaic, a photodetector or a photoconductor. Whenever the organic photosensitive optoelectronic devices of the present invention function as a PV device, the materials used in the photoconductive organic layers and the thicknesses thereof may be selected, for example, to optimize the external quantum efficiency of the device. Whenever the organic photosensitive optoelectronic devices of the present invention function as photodetectors or photoconductors, the materials used in the photoconductive organic layers and the thicknesses thereof may be selected, for example, to maximize the sensitivity of the device to desired spectral regions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\forall$ (where $\forall$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, these competing guidelines may result in tradeoffs being made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high external quantum efficiency for the overall device.

The organic photosensitive optoelectronic devices may function as photodetectors. As a photodetector, the device may be a multilayer organic device, for example as described in U.S. Published Patent Application No. 2005-0110007 A1, published May 26, 2005 to Forrest et al., incorporated herein by reference in its entirety. In this case an external electric field may be generally applied to facilitate extraction of the separated charges.

A concentrator or trapping configuration can be employed to increase the efficiency of the organic photosensitive optoelectronic device, where photons are forced to make multiple passes through the thin absorbing regions. U.S. Pat. No. 6,333,458 to Forrest et al. and U.S. Pat. No. 6,440,769 to Peumans et al., both incorporated herein by reference in their entirety, address this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the photoresponsive material. The geometries disclosed in U.S. Pat. Nos. 6,333,458 and 6,440,769 therefore enhance the external. quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

Coatings may be used to focus optical energy into desired regions of a device. U.S. patent application Ser. No. 10/857, 747, filed Jun. 1, 2004, which is incorporated by reference in its entirety, provides examples of such a coating.

Organic photovoltaic (PV) cells have the potential to provide low cost solar energy conversion due to their relative ease of processing and compatibility with flexible substrates. The photogeneration process in these devices relies on the dissociation of excitons, or bound electron-hole pairs, at a donor-acceptor heterojunction (DA-HJ). Excitons, however, must be generated sufficiently close to the DA-HJ such that they can diffuse to this interface before recombining. Different methods have been employed to avoid this so-called 'exciton diffusion bottleneck' in small molecular weight organic semiconductor based PV cells, such as using mixed DA materials, materials with long exciton diffusion lengths, or by connecting multiple devices in a series connection. The performance of such devices utilizing these various strategies has recently increased dramatically, reaching power conversion efficiencies (up) as high as 5.7% under AM1.5G simulated solar illumination.

Figure 14:
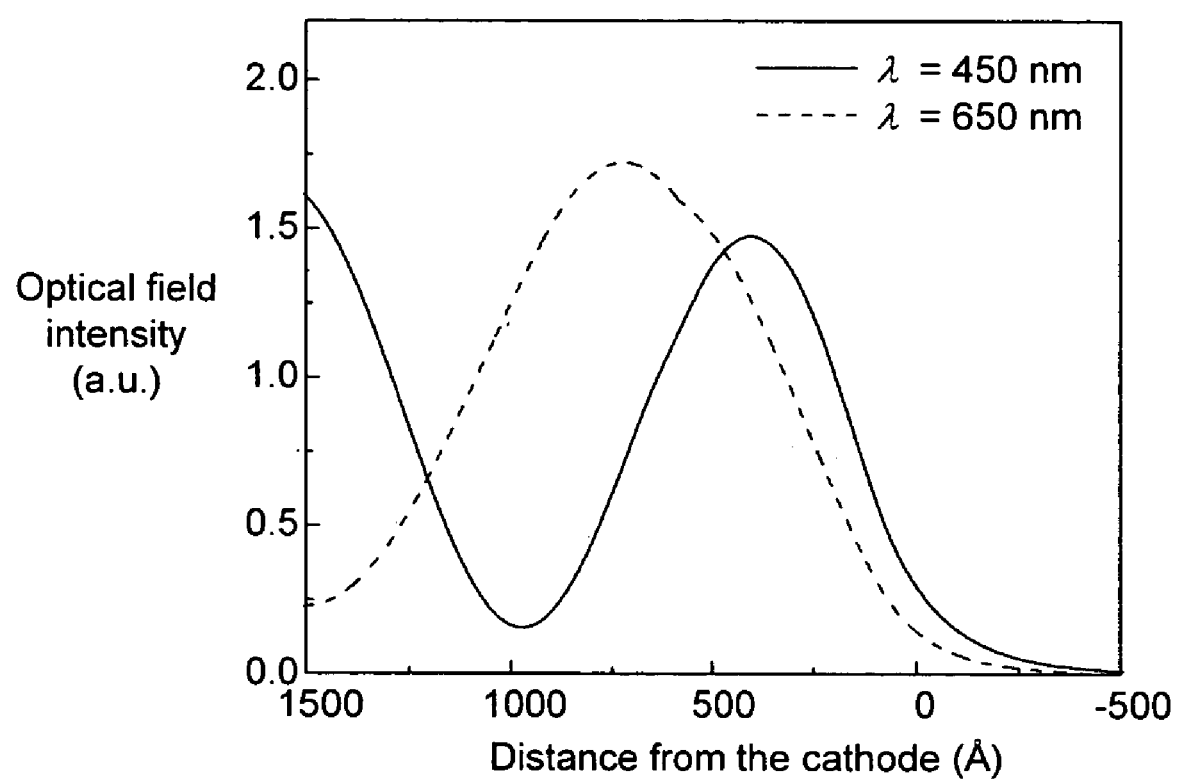
FIG. 14 shows example positions of the optical field intensity relative to the distance from a reflective cathode.

High efficiency small-molecule based devices many times include an exciton blocking layer (EBL) inserted between the acceptor-type molecular layer and the cathode. The EBL serves a number of functions, including preventing damage to the photoactive layer during cathode deposition, thereby eliminating exciton quenching at the acceptor/cathode interface. This material should be transparent across the solar spectrum to act as a spacer between the photoactive region and the metal interface to allow for increased absorption at the active DA interface where photo-induced charge transfer occurs. Furthermore the EBL must transport charge to ensure a low cell series resistance and high responsivity. In the case of a material that satisfies all of these criteria, the EBL should also be sufficiently thick to place the region of highest incident optical light intensity at the DA-HJ, which is located at a distance of approximately an integer multiple of wavelengths divided by twice the index of refraction of the organic material ($\lambda/2n$) from the metal cathode, where electrostatic boundary conditions demand that the incident optical field intensity vanishes. Examples of the relationship between wavelength, light intensity, and distance from a reflective metal cathode are shown in FIG. 14. By adjusting the thickness of an EBL between the DA-HJ and the cathode, the position of the field intensity peaks can be optimized.

Also, thick EBLs are practically important for fabricating large-area devices with a low density of electrical shorts. Bathocuproine (BCP) has typically been used as an EBL material in small molecular-weight organic PVs. However, its large energy gap and resistance make it unsuitable for use as a thick layer, where increased cell series resistance degrades device performance. Doping the EBL to retain a low series resistance has proven to be an effective solution in allowing the use of thicker EBL layers (see Maennig et al., Applied Physics A 79, 1 (2004)), as has the use of a thick 3,4,7,8 napthalenetetracarboxylic dianhydride layer (see Suemori, Applied Physics Letters 85, 6269 (2004)).

Figure 11:
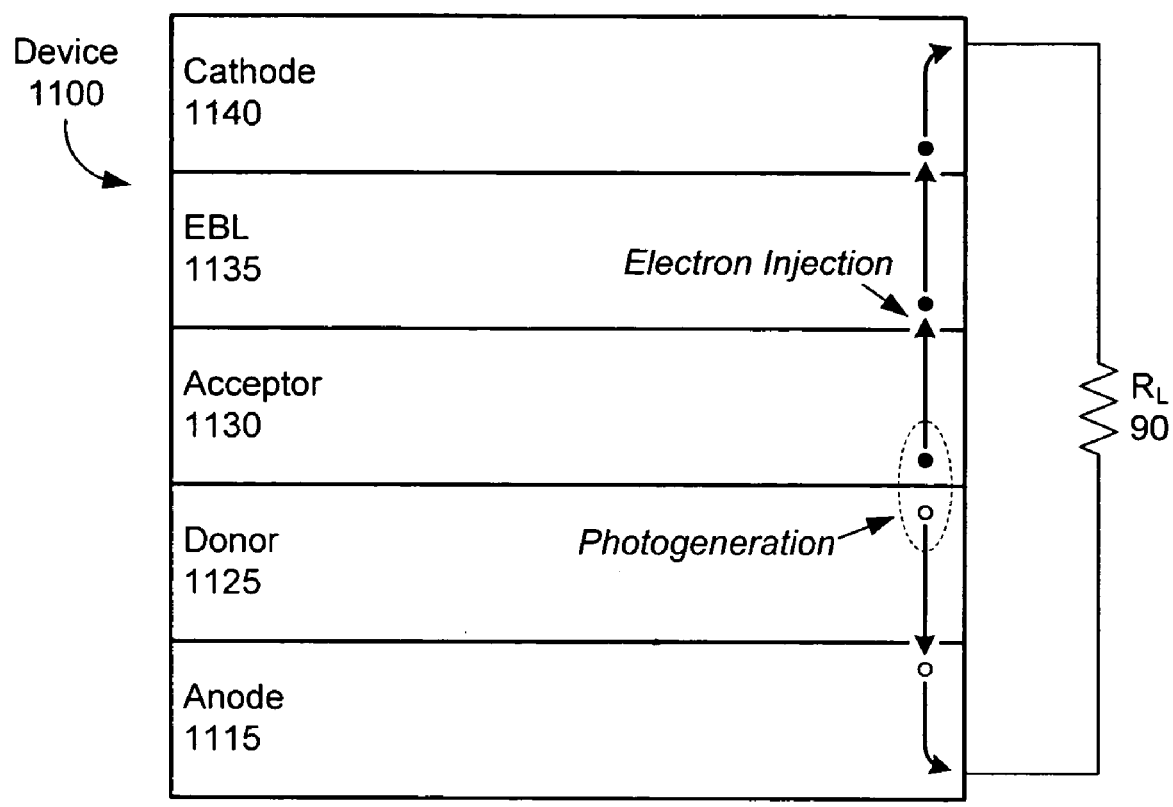
FIG. 11 shows the theory of operation of exciton blocking layers in accordance with the prior art, the exciton blocking layer transporting electrons from the acceptor to the cathode.
Figure 12:
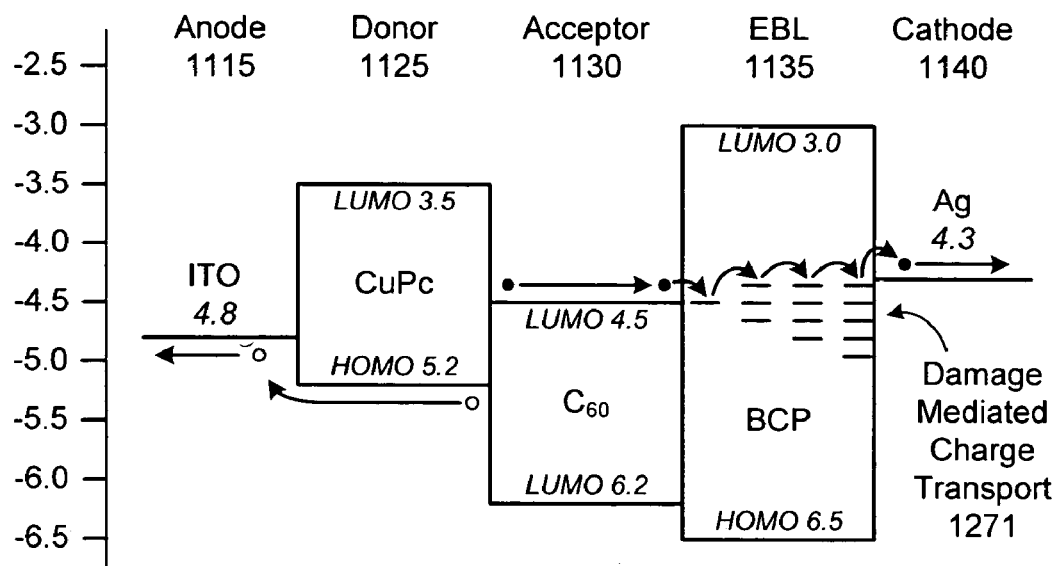
FIG. 12 is a schematic energy level diagram illustrating a BCP exciton blocking layer transporting electrons from the acceptor to the cathode in accordance with the prevailing theory of operation in the prior art.

Prior to the work described herein, it was believed that BCP was effective as an EBL material due to damage-mediated charge transport of electrons. An example of the theoretical carrier transport in a device 1100 is illustrated in FIG. 11, in which a photogenerated electron travels from the acceptor 1130, by damage-mediated charge transport 1271 through the EBL 1135, to the cathode 1140 and a load 90. As illustrated in FIG. 12, formation of the Ag cathode layer 1140 induces damage in the BCP EBL 1135, which was believed to enable the transport of electrons from the acceptor 1130 to the cathode 1140. Also illustrated in FIG. 12 are an anode 1115 and a donor 1125. For an example of damage-induced electron transport with BCP, see U.S. Published Patent Application No. 2002/0189666 A1 published Dec. 19, 2002 to Forrest et al.

The belief that BCP depended on damage-induced electron transport had several practical consequences, including choice of dopants (if any) and the choice of other materials that might be used (e.g., instead of BCP). However, since carrier transport depends upon cathode-induced damage, BCP was viewed as unsuitable for thick layers, due the relatively shallow effectiveness of the damage, resulting in high resistance for thick layers. This knowledge acted as a limitation on the thickness of the EBL, limiting the extent to which the position of the peak optical intensity could be adjusted (e.g., FIG. 14). Moreover, BCP-based EBLs were seen as unsuitable for most inverted devices (devices with the cathode near the substrate), since an EBL deposited on the cathode would not be damaged, and thus, would have high resistance even as a thin layer.

Research described herein reveals that the prevailing theory of damage-induced electron transport through BCP may be incorrect. New experimental results, described below and illustrated in FIG. 13, reveal that the EBL 1335 is actually transporting disassociated holes via damage mediated charge transport 1372 from the cathode 1140 to the acceptor 1130, with electron-hole recombination occurring at the acceptor-EBL interface. While the general theory regarding damage states being responsible for charge transport in BCP appears to be correct, the identity of which carrier is transported may have been incorrect.

Knowledge that holes disassociate at the cathode to be carried to the acceptor for recombination causes us to revisit some of the basic tenets of device design. Specifically, a whole new class of materials that had never been considered as usable for an EBL layer between the acceptor and the cathode can now be considered. Moreover, if dopant is added to the EBL (e.g., to maintain an amorphous state), the choice of dopants can be better optimized to complement the transport of the holes.

Figure 2A:
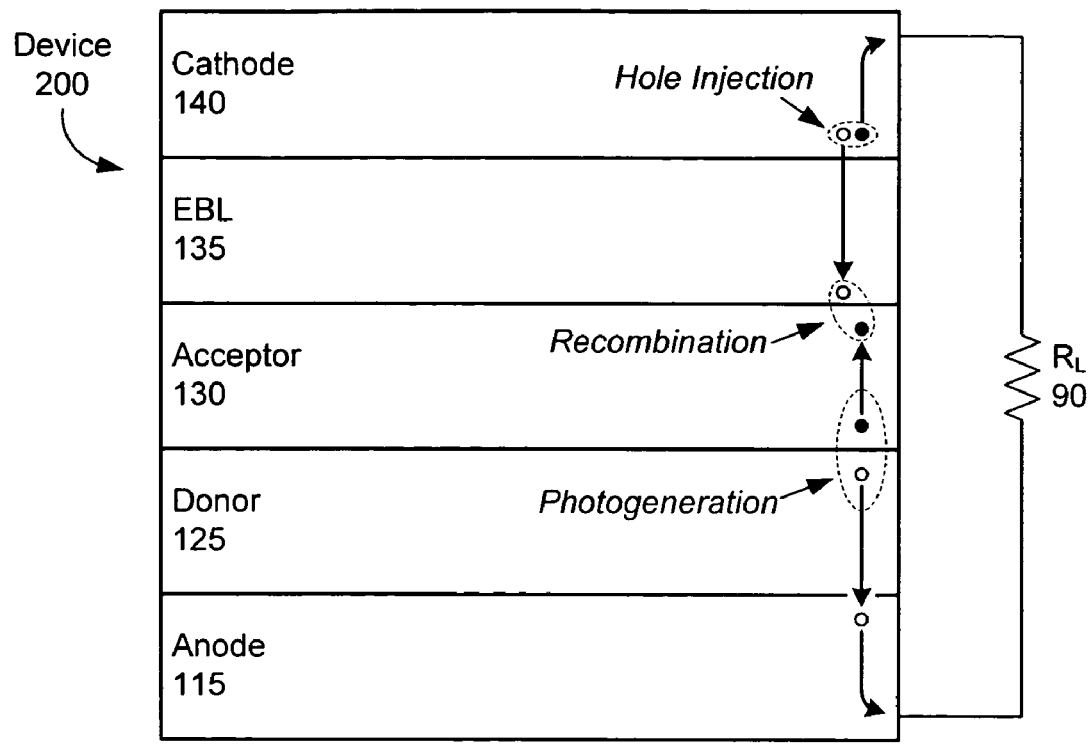
FIG. 2A shows the theory of operation of exciton blocking layers in accordance with embodiments of the present invention, the exciton blocking layer transporting holes disassociated at the cathode to the acceptor.
Figure 2B:
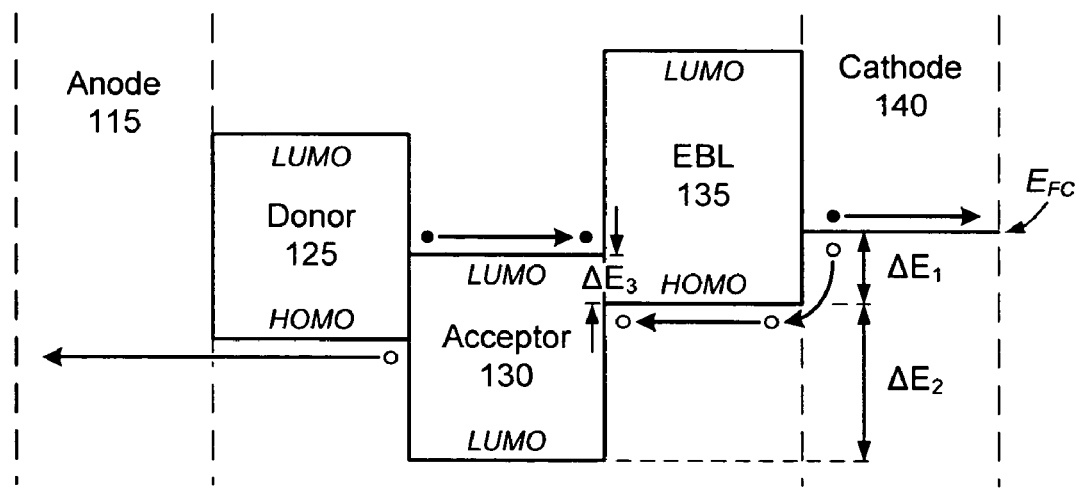
FIG. 2B is a schematic energy level diagram for a double heterostructure device including the exciton blocking layer employing the theory of operation of FIG. 2A.

FIGS. 2A and 2B illustrate operation of a device 200 in accordance with embodiments of the present invention. A hole disassociates from an electron in cathode 140, to be transported through the EBL 135 for recombination at the acceptor-EBL interface. The orientation of the device 200 is not important, as it may be a regular (cathode on top) or an inverted (cathode on bottom) device.

Applying this new theory of operation, the characteristic energy levels of the materials may be selected as demonstrated with FIG. 2B.

A first departure from prior designs is the position of the HOMO of the EBL 135 relative to the HOMO of the acceptor 130 ($\Delta E_2$). In prior art designs, since EBLs were designed to primarily rely upon hole-blocking to prevent exciton quenching, the HOMO of the acceptor needed to be higher (less negative) than the HOMO of the EBL. However, as embodiments of the present invention primarily utilize hole transport, the HOMO of the EBL 135 may be set higher than or equal to the HOMO of the acceptor 130.

A second departure from prior designs is the selection of materials for the EBL that have a hole mobility of at least $10^{-7}$ cm$^2$/V-sec or higher. While damaged-induced carrier transport in materials such as BCP does not per se rely upon the mobility of the material, if an undamaged material was selected to transport carriers through the EBL, carrier mobility would be an important consideration. However, it follows from the prior art to maximize the mobility of electrons, rather than holes, since the phenomena of hole disassociation at the cathode was not recognize. This relatively high hole mobility of at least $10^{-7}$ cm$^2$/V-sec or higher provides a threshold to avoid domination by EBL resistivity over the exciton diffusion bottleneck, which would degrade device performance. Higher mobilities, such as at least $10^{-6}$ cm$^2$/V-sec or higher, are preferred.

A third departure from prior designs is the energy level difference $\Delta E_1$ between the Fermi level ($E_F$) of the cathode 140 and the HOMO of the EBL 135. In the prior art, the position of the Fermi level was optimized for the injection of electrons from the EBL into the cathode. Applying this new knowledge, the Fermi level may be better optimized for the injection of holes from the cathode to the EBL. Preferably, for good injection of holes, the Fermi level of the cathode is no more than 1 eV higher than the HOMO of the exciton blocking layer. More preferably, the Fermi level of the cathode is not higher than the HOMO. This may also be expressed as the work function of the cathode being no more than 1 eV smaller than the ionization potential of the EBL, where the ionization potential is the energy difference between the vacuum level and the HOMO.

A fourth departure from prior designs is the energy level difference $\Delta E_3$ between the LUMO of the acceptor 130 and the HOMO of the LUMO 135. In the prior art, this difference was typically very large, since the HOMO of the EBL was selected to block the injection of holes from the acceptor into the EBL (as a means of exciton blocking). However, since embodiments of the present invention employ hole transport through the EBL toward the acceptor, a larger difference $\Delta E_3$ results in energy lost to electron hole recombination (e.g., phonon generation). Accordingly, rather than employing a large $\Delta E_3$ as in the prior art to block holes/excitons, it is preferred that this difference $\Delta E_3$ is minimized. Preferably, the HOMO of the exciton blocking layer 135 is no more than 1 eV below the LUMO of the acceptor 130.

Preferably, the material used for the EBL 135 has the hole mobility of at least $10^{-7}$ cm$^2$/V-sec or higher in the absence of dopants and impurities. However, that is not to say that the EBL 135 is not doped. For example, as described above, the EBL 135 may be doped to help prevent recrystalization.

So long as the EBL 135 blocks excitons and transports holes, the electron-related characteristics of the EBL material are not essential. Some electron transport can be tolerated, so long as excitons cannot pass through to quench at the cathode 140. For example, not all recombination need occur at the acceptor-EBL interface; recombination may also occur in the EBL itself.

Although the device 200 in FIG. 2A is illustrated as being connected to a resistive load 90, suggesting a photovoltaic, the presence of the load is purely for demonstration purposes. In practice, device 200 can be any type of photosensitive cell, including a photoconductor cell (in which case the device would be connected to signal detection circuitry to monitor changes in resistance across the device due to the absorption of light) or a photodetector (in which case the device would be connected to a current detecting circuit which measures the current generated when the photodetector is exposed to light, and in which a bias voltage might be applied to the device). This is also true for the devices in the other drawings.

Although intervening layers such as smoothing layer 120 is not shown in FIG. 2A, other layers may be present. This is also true for the devices in the other drawings.

Experiments

Figure 3A:
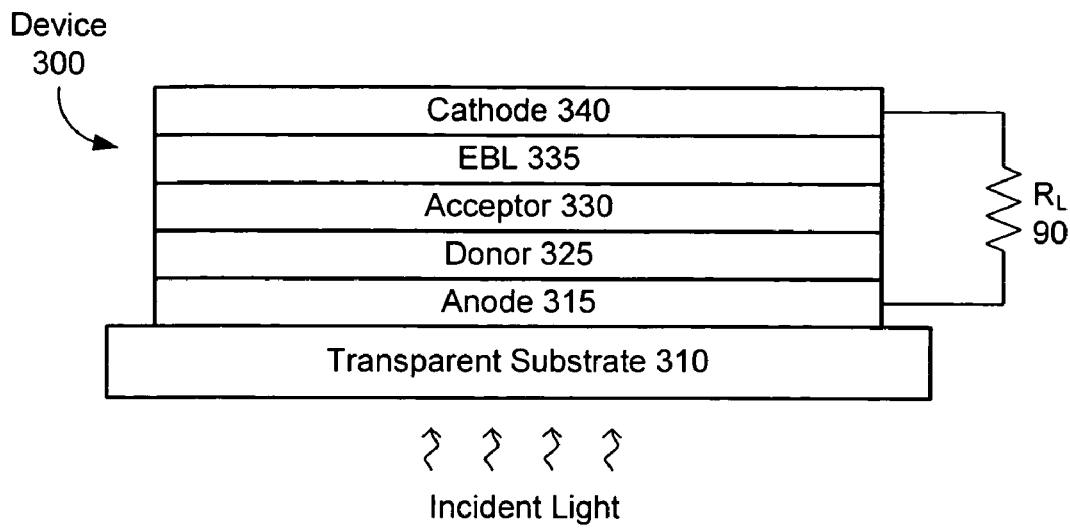
FIG. 3A is an example double heterostructure device using a Ru(acac)$_3$ exciton blocking layer to transport disassociated holes from the cathode to the acceptor.
Figure 3B:
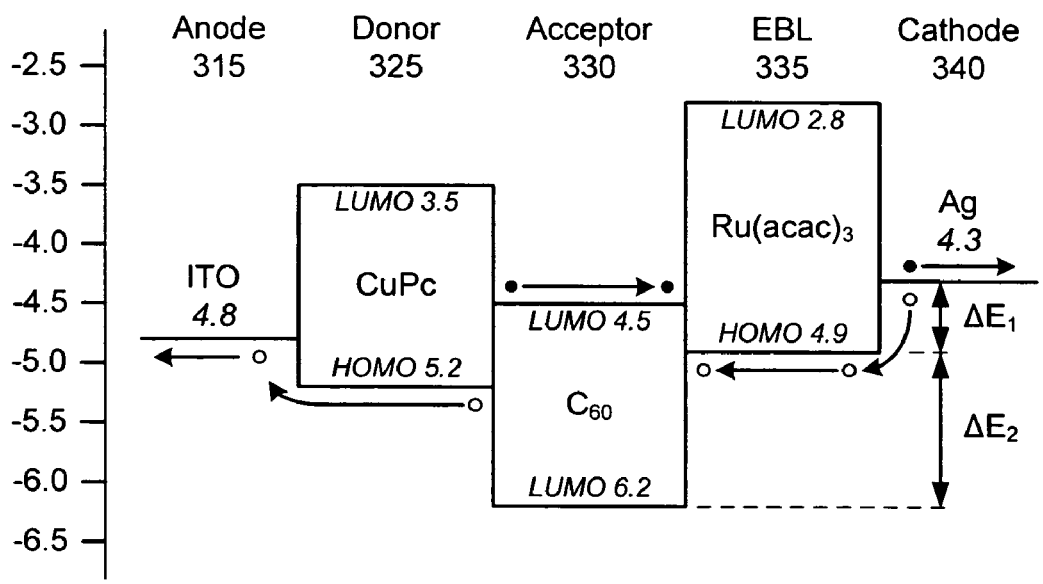
FIG. 3B is a schematic energy level diagram for the double heterostructure device in FIG. 3A.

An experimental device architecture 300 is illustrated in FIGS. 3A and 3B which satisfies the preferred parameters for embodiments of the present invention. $C_{60}$ was selected as the acceptor 330, tris(acetylacetonato)ruthenium(III) (Ru(acac)$_3$) as the EBL material 335, and Ag as the cathode 340. Additionally, ITO was used as the anode 315, CuPC was used as the donor 325, and the substrate 310 was glass. In comparison to a BCP-based device, the thickness of EBL 335 can be increased without a loss in power conversion efficiency.

To understand differences in blocking layer performance between BCP-and Ru(acac)$_3$-based devices, ultraviolet photoelectron spectroscopy (UPS) was used to measure the offset energy of the highest occupied molecular orbital (HOMO) level at the $C_{60}$/EBL interface, and confirm previous studies that show that charge transport in BCP is due to damage induced during deposition of the Ag cathode, while the small ionization potential of Ru(acac)$_3$ allows for hole transport to the type II $C_{60}$/Ru(acac)$_3$ HJ where recombination with photogenerated electrons can occur.

Figure 4:
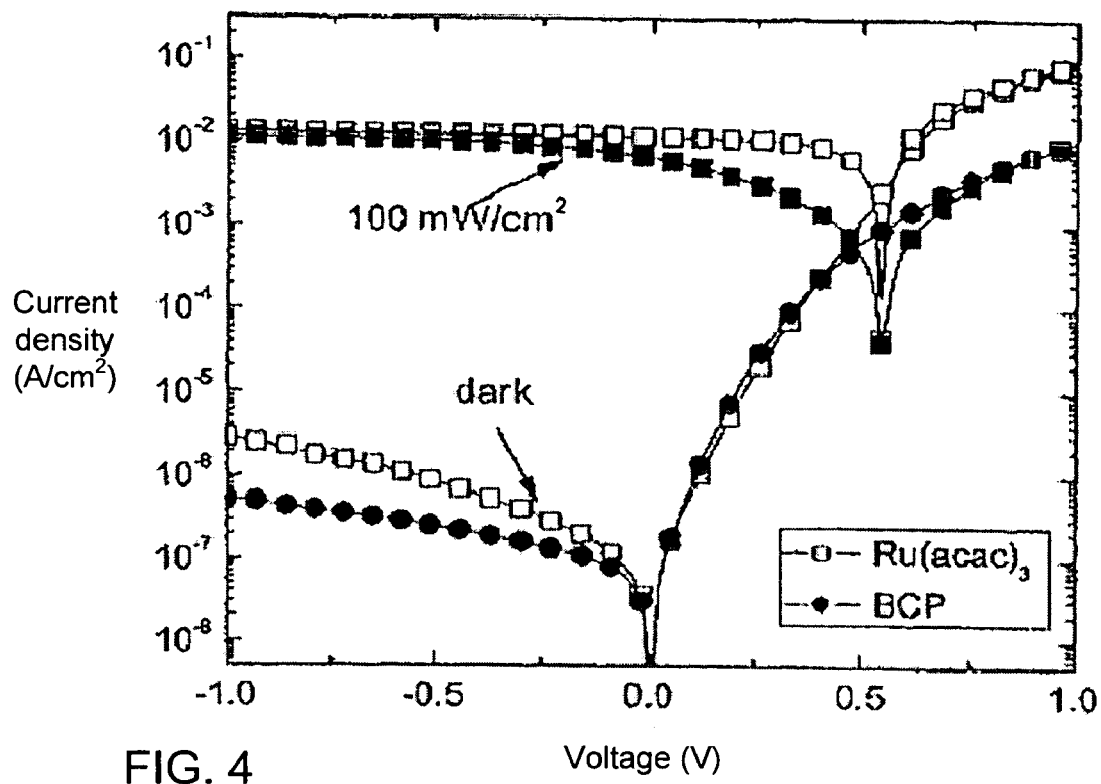
FIG. 4 shows current density vs. voltage characteristics in the dark and under 1 sun (100 mW/cm$^2$) intensity of simulated AM1.5G solar illumination of organic photovoltaic cells with the following structure: ITO/CuPc(200 Å)/C$_{60}$(400 Å)/EBL(200 Å)/Ag(1000 Å) where the exciton blocking layer (EBL) consists of either BCP (filled circles) or Ru(acac)$_3$ (open squares).

FIG. 4 shows the current density-voltage (J-V) characteristics in the dark and under 1 sun (100 mW/cm$^2$) AM1.5G simulated solar illumination for devices with the structure ITO/CuPc/$C_{60}$/EBL(200 Å)/Ag (ITO: indium tin oxide, CuPc: copper phthalocyacine), where the EBL consists of either BCP (filled circles) or Ru(acac)$_3$ (open squares). From fits of the dark J-V characteristics to classical p-n junction diode theory a series resistance $R_S$=40.6 $\Omega$cm$^2$ and $R_S$=3.6 $\Omega$cm$^2$ and ideality factors of n=2.2±0.1 and n=1.9±0.1 can be inferred for the BCP and Ru(acac)$_3$ devices, respectively. Under 1 sun illumination, the responsivity (equal to $J_{SC}/P_0$, where $J_{SC}$ is the short circuit current density and $P_0$ is the incident light intensity) of the BCP and Ru(acac)$_3$ devices are (0.07±0.01) A/W and (0.09±0.01) A/W with fill factors equal to FF=0.29±0.02 and FF=0.58±0.03, respectively. An open circuit voltage of $V_{OC}$=(0.52±0.02) V is obtained for both devices. These characteristics result in cell power conversion efficiencies, $\eta_P$=($V_{OC}J_{SC}$FF)/$P_0$, of $\eta_P$= (1.1±0.1)% and (2.7±0.2)% for 200-Å-thick BCP and Ru(acac)$_3$ EBL devices.

Figure 5A:
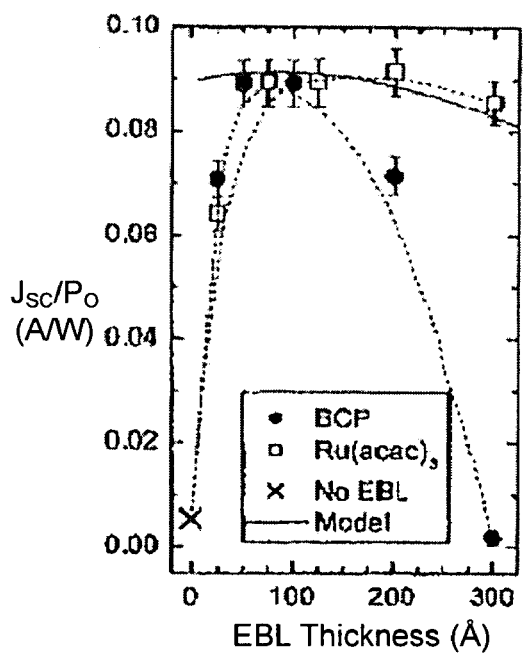
FIG. 5A shows responsivity, J$_{SC}$/P$_0$.
Figure 5B:
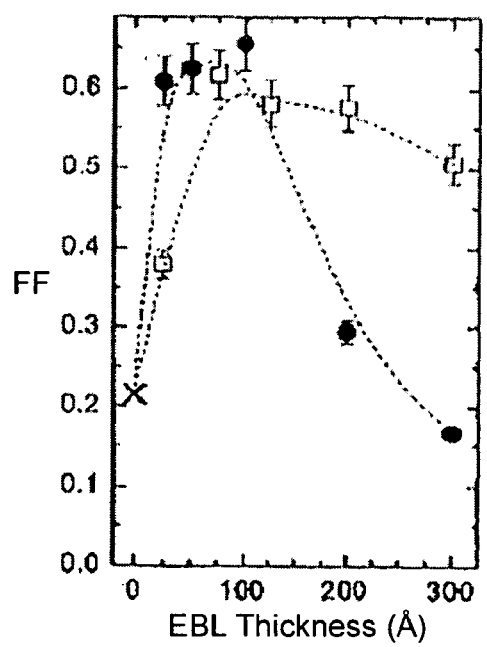
FIG. 5B shows fill factor (FF) of devices with the same structure as FIG. 4 under 1 sun (100 mW/cm$^2$) simulated AM1.5G solar illumination where the EBL thickness is varied from 0–300 Å. The device with no EBL is marked by an "X." The solid line in FIG. 5A is calculated J$_{SC}$/P$_0$ and the dashed lines serve as guides to the eye.

FIGS. 5A and 5B show responsivity and FF, respectively, as a function of EBL thickness for the device structure in 4. Note that devices lacking an EBL have both a low responsivity and FF due to quenching at the $C_{60}$/Ag interface as well as at defects induced during Ag deposition on the $C_{60}$ surface. The BCP and Ru(acac)$_3$ devices show a peak in performance at a thickness of 100 Å. However, the responsivity and FF of the BCP devices decrease rapidly for larger EBL thicknesses whereas the responsivity of the Ru(acac)$_3$ device falls off more gently due to a decrease in optical intensity at the DA interface with increasing thickness. This effect is accurately predicted using models introduced elsewhere (solid line, FIG. 5A). The deviation from the optical model at EBL thicknesses <50 Å is due to exciton quenching at the $C_{60}$/Ag interface.

Figure 6:
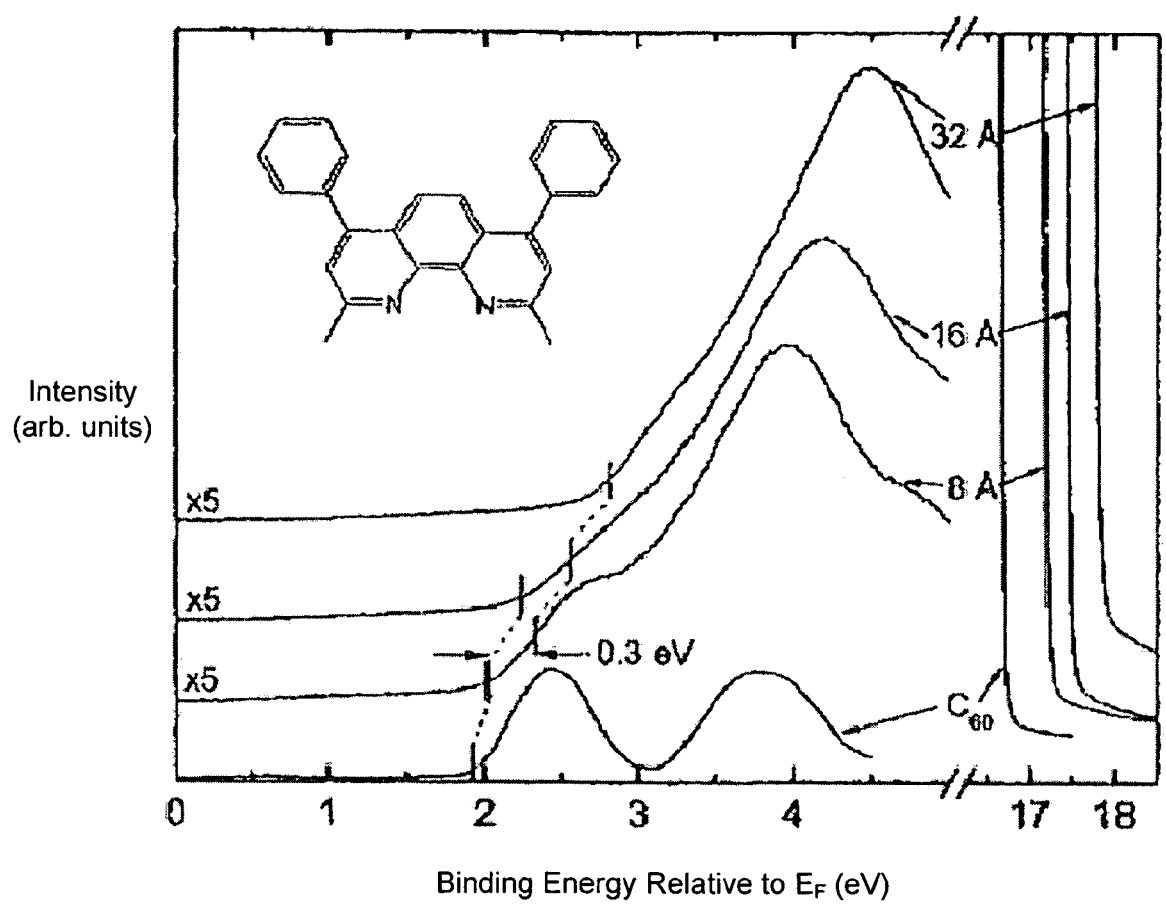
FIG. 6 shows an ultraviolet photoelectron spectra of a 200-Å-thick neat C$_{60}$ film with BCP overlayer thicknesses of 8, 16, and 32 Å. The short vertical lines indicate the position of the HOMO. The Fermi energy, E$_F$, is the reference for the binding energy. The inset shows the chemical structure of BCP.

Ultraviolet Photoelectron Spectroscopy (UPS) was used to study the evolution of the HOMO, or ionization potential, of the organic interface between $C_{60}$ and the EBL as a means to understand these two double-heterostructure PV cells. The evolution of the UPS spectra of an overlayer of BCP on a 200-Å-thick $C_{60}$ film shown in FIG. 6. The UPS spectrum of neat films of $C_{60}$ (bottom spectrum, FIG. 6) and BCP yield HOMO levels of (6.2±0.1) eV and (6.5±0.1) eV, respectively, in agreement with literature values (see Hill et al., Journal Applied Physics 86, 4515 (1999); Mitsumoto et al., Journal of Physical Chemistry A 102, 552 (1998)). As can be seen in FIG. 6, the deposition of increasing amounts of BCP on $C_{60}$ results in a rigid shift of the spectrum toward higher binding energy. This is caused either by band-bending, or by charging within the wide energy gap BCP layer. By fitting the UPS spectrum at BCP overlayer thicknesses of 8 and 16 Å to a Gaussian shape, a HOMO level offset of ~0.3 eV toward higher binding energy can be inferred, indicating that the vacuum levels at the $C_{60}$/BCP interface align. Upon deposition of a 32 Å BCP overlayer, the UPS spectrum resembles that of neat BCP, indicating that the $C_{60}$ is completely covered.

Figure 7:
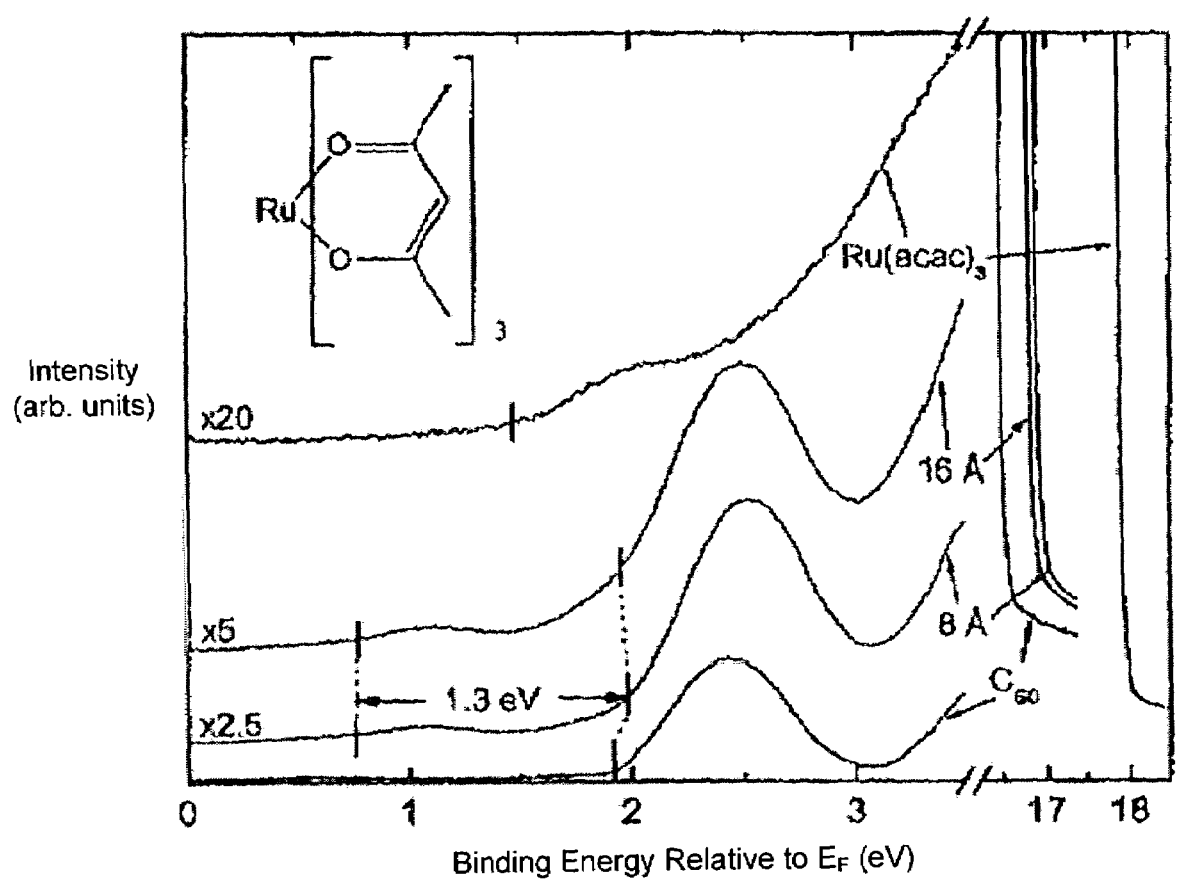
FIG. 7 shows an ultraviolet photoelectron spectra (UPS) of a 200-Å-thick neat C$_{60}$ film with Ru(acac)$_3$ overlayer thicknesses of 8 and 16 Å. The top spectrum shows the UPS spectrum of a 200-Å-thick neat Ru(acac)$_3$ film. The short vertical lines indicate the position of the HOMO. The Fermi energy, $E_F$, is the reference for the binding energy. The inset shows the chemical structure of $Ru(acac)_3$.

The spectrum of neat Ru(acac)$_3$ and the evolution of the $C_{60}$/Ru(acac)$_3$ HJ are shown in FIG. 7. The HOMO level of Ru(acac)$_3$ is measured as (4.9±0.1) eV. Upon deposition of a thin layer Ru(acac)$_3$ on $C_{60}$, another rigid shift of the spectrum is observed due to band-bending or charging effects. The HOMO of Ru(acac)$_3$ is (1.3±0.1) eV lower than that of $C_{60}$, indicating the alignment of the vacuum levels at the $C_{60}$/Ru(acac)$_3$ interface without the presence of an appreciable interface dipole.

Figure 13:
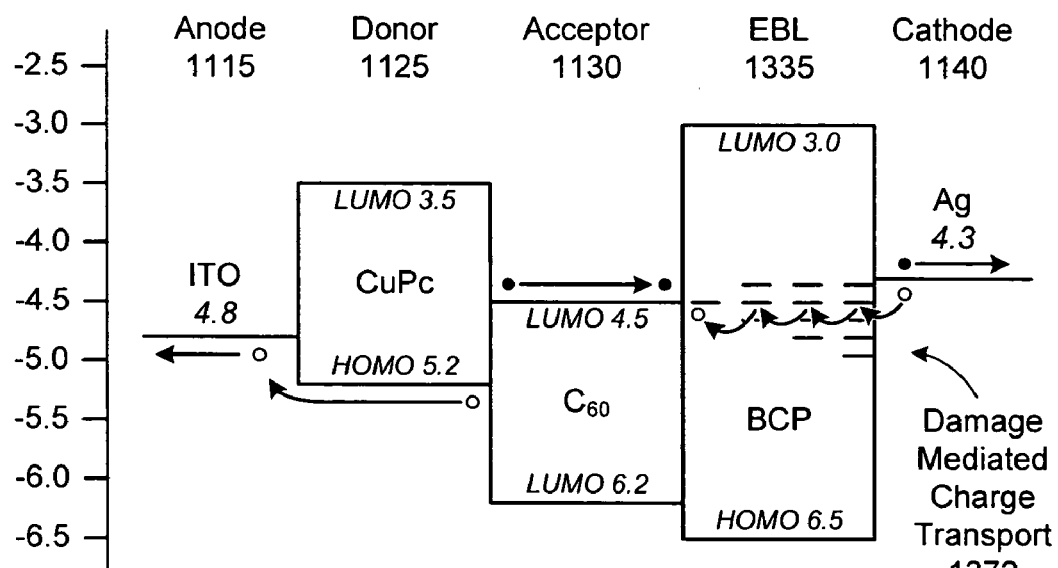
FIG. 13 is a schematic energy level diagram illustrating that a BCP exciton blocking layer is actually transporting holes from the cathode to the acceptor as revealed by experiments described herein.

The UPS results suggest the energy diagrams in FIG. 3B and FIG. 13 of the two double HJ PV cells. Here, the HOMO energies are taken from UPS measurements, whereas the lowest unoccupied molecular orbital (LUMO) energies are estimated using the optical energy gap of each material. In the case of the BCP device (FIG. 13), the Ag cathode deposition allows for damage-mediated charge transport of carriers through the BCP layer. As shown previously, the damage depth is ~100 Å, with thicker BCP EBLs resulting in reduced photocurrent (c.f. FIG. 5A). Note that the LUMO-LUMO offset between $C_{60}$ and the EBL is approximately the same for both materials, ~(1.5±0.1) eV for $C_{60}$/BCP and ~(1.7±0.1) eV for $C_{60}$/Ru(acac)$_3$. Therefore, it is unlikely that photogenerated electrons are transported through the Ru(acac)$_3$ layer. Furthermore, the hole conductivity of Ru(acac)$_3$ is measured to be $\sigma_h$=2.2×10$^{-7}$ S/cm, which exceeds that of electrons by two orders of magnitude. However, the energy alignment suggests that holes can be injected from the Ag cathode into the Ru(acac)$_3$ layer (FIG. 3B), where they are transported prior to recombination with electrons at the $C_{60}$/Ru(acac)$_3$ interface.

Figure 8:
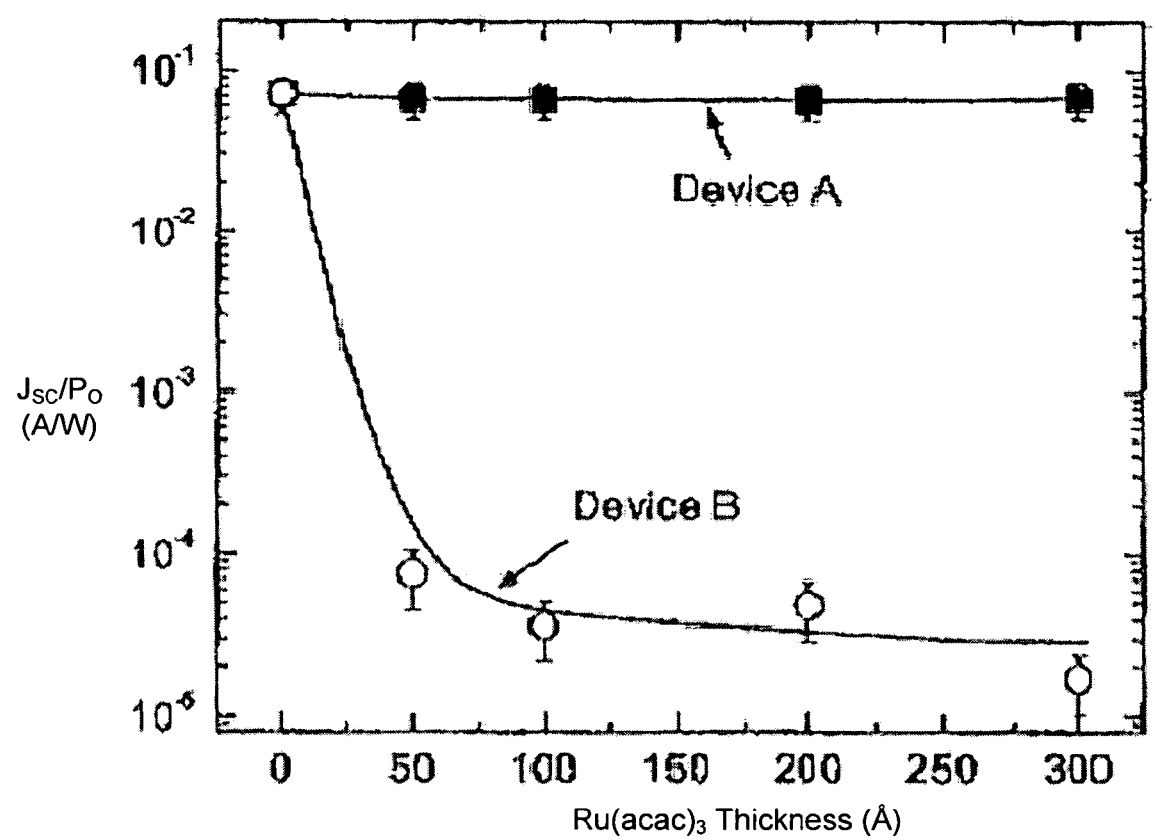
FIG. 8 shows responsivity, $J_{SC}/P_0$, of the following devices under 1 sun (100 mW/cm$^2$) simulated AM1.5G solar illumination where the $Ru(acac)_3$ thickness is varied from 0–300 Å; Device A: ITO/CuPc(200 Å)/C$_{60}$(400 Å)/Ru(acac)$_3$/BCP (200 Å)/Ag(1000 Å), Device B: ITO/CuPc (200 Å)/C$_{60}$(400 Å)/BCP(200 Å)/Ru(acac)$_3$/Ag(1000 Å). The solid lines serve as guides to the eye.

To confirm this process, the performance of two devices were compared with the following layer structures; Device A: ITO/CuPc/$C_{60}$/Ru(acac)$_3$/BCP/Ag and Device B: ITO/CuPc/$C_{60}$/BCP/Ru(acac)$_3$/Ag. The responsivity of these two devices are shown in FIG. 8. The Device A, consisting of a Ru(acac)$_3$/BCP EBL, has a responsivity equivalent to a device containing only a BCP EBL for Ru(acac)$_3$ thicknesses of up to 300 Å. The Device B, has a responsivity three orders of magnitude below that of Device A for any Ru(acac)$_3$ layer thickness. This is due to the inability, for photogenerated electrons to be transported to the cathode since damage to the BCP layer during the;Ag cathode deposition was prevented by the Ru(acac)$_3$ cap. In contrast, BCP is able to transport holes to the Ru(acac)$_3$ layer via damage induced defect states in Device A, as suggested in FIG. 13.

Small molecular weight PV cells used to study EBL properties were fabricated on 1500-Å-thick layers of ITO commercially precoated onto glass substrates with a sheet resistance of 15 Ω/square. The solvent cleaned ITO surface was treated in ultraviolet/$O_3$ for 5 minutes immediately before loading the substrates into a high vacuum chamber (~3×10$^{-7}$ Torr), where organic layers and a Ag cathode were deposited via thermal evaporation. A quartz crystal monitor was used to determine film thickness and deposition rate. Prior to deposition, the organic materials were purified in three cycles using vacuum thermal gradient sublimation. The device structure consists of a 200-Å-thick layer of the donor, CuPc, a 400-Å-thick $C_{60}$ acceptor layer, and an EBL consisting of either BCP (see FIG. 6, inset) or Ru(acac)$_3$ (see FIG. 7, inset). Finally, a 1000-Å-thick Ag cathode was evaporated through a shadow mask with 1 mm diameter openings. The J-V characteristics were measured in the dark and under simulated AM1.5G solar illumination (Oriel Instruments) using an HP4155B semiconductor parameter analyzer. Illumination intensity was measured using a calibrated broadband optical power meter. Organic material studied with UPS were grown by ultrahigh vacuum organic molecular beam deposition on highly doped n-Si(100) substrates coated with 500-Å-thick in situ deposited Ag layers. HeI emission (21.22 eV) from a VG UPS/2 lamp (Thermo VG Scientific) was used as a photon source, and the spectra were collected with a multichannel hemispherical VG CLAM4 electron energy analyzer. The UPS measurement resolution is 0.1 eV.

Figure 9A:
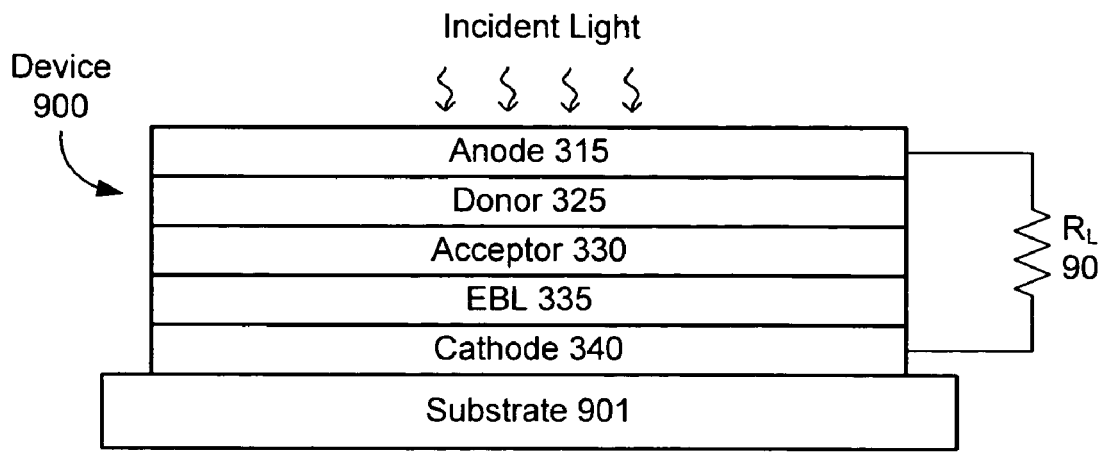
FIG. 9A is an example inverted double heterostructure device using a $Ru(acac)_3$ exciton blocking layer to transport disassociated holes from the cathode to the acceptor.
Figure 9B:
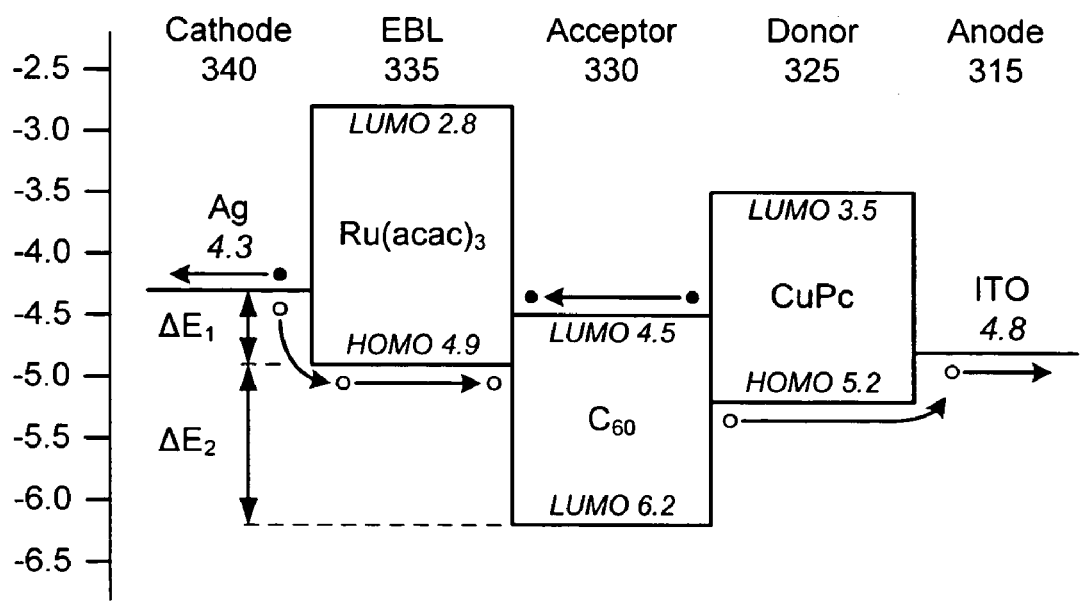
FIG. 9B a schematic energy level diagram for the double heterostructure device in FIG. 9A.
Figure 10A:
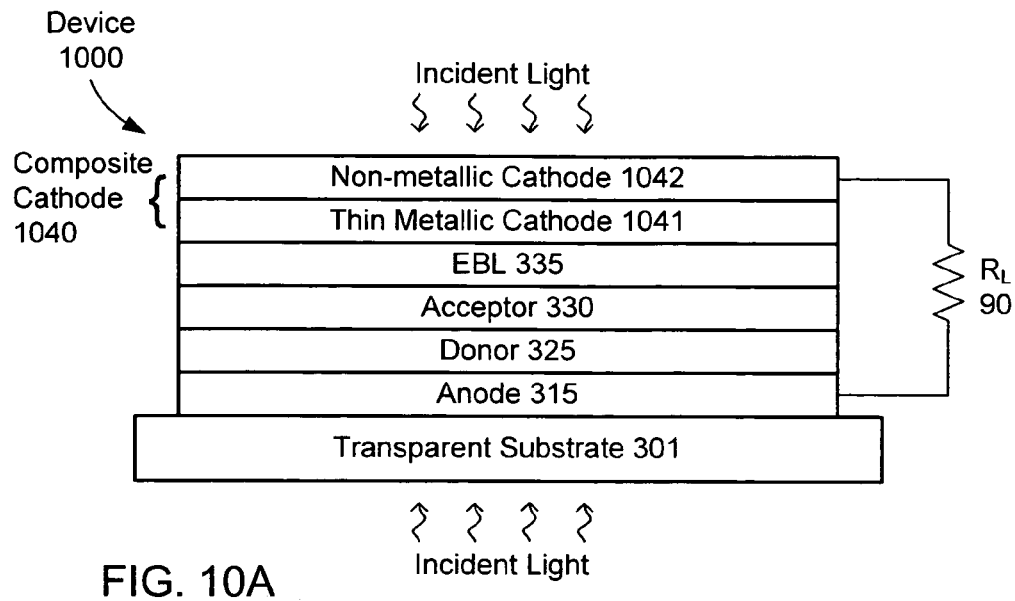
FIG. 10A is an example double heterostructure device having a compound cathode and using a $Ru(acac)_3$ exciton blocking layer to transport disassociated holes from the cathode to the acceptor.
Figure 10B:
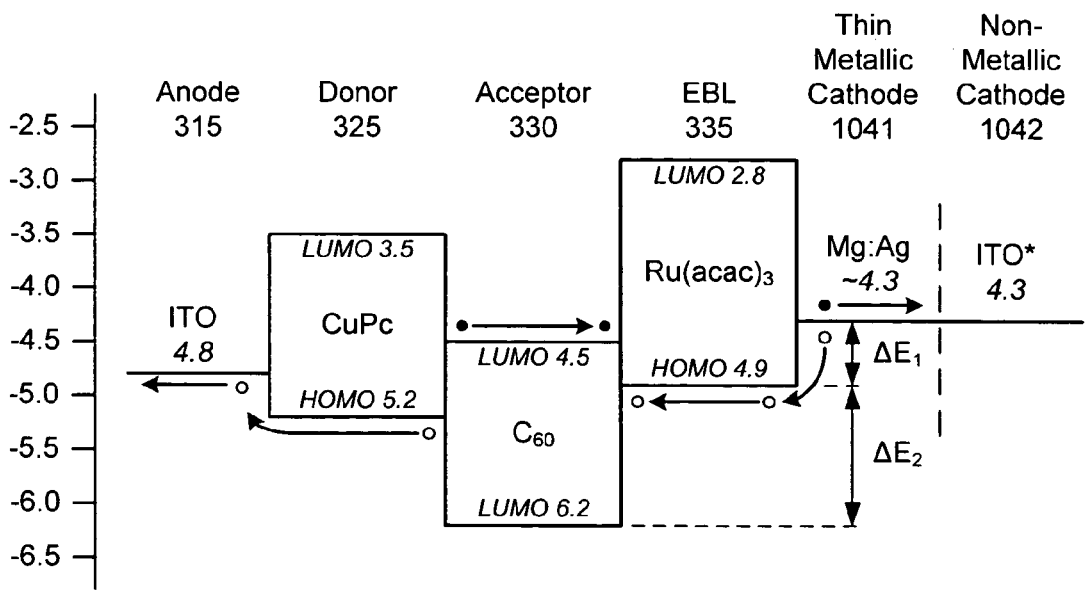
FIG. 10B is a schematic energy level diagram for the double heterostructure device in FIG. 10A.

Although not actually fabricated, FIGS. 9A and 9B demonstrate an inverted device 90. The substrate 901 may or may not be transparent. Similarly, FIGS. 10A and 10B demonstrate a device 1000 employing a composite cathode 1040. Any type of composite cathode 1040 may be used, as described above. In this example, the composite cathode comprises a thin metallic cathode 1041 and a non-metallic cathode 1042. For the non-metallic cathode 1042, room-temperature sputtered ITO without surface treatment (ITO*) is used to achieve a work function commensurate with a metal cathode. The work function for ITO* may be as low as 4.0 eV to 4.3 eV. In comparison, commercially obtained ITO and the ITO used for the anode received a surface treatment (e.g., UV-ozone, oxygen plasma) to obtain a work function of 4.8 eV. Although device 1000 is shown with a transparent anode and substrate, a reflective anode (e.g., gold), intervening layer, or substrate material may be used. Likewise,in FIG. 9, a transparent cathode (e.g., ITO*) and substrate may be used, and either the anode may be made reflective (e.g., gold), or a reflective layer may be added.

In conclusion, an efficient organic double-heterostructure photovoltaic cell has been demonstrated employing an exciton blocking layer which does not rely on cathode induced damage for charge transport. By experiments, it has been found that high power conversion efficiencies are obtained for Ru(acac)$_3$ thicknesses up to 300 Å, whereas BCP-based devices experience a rapid falloff of both responsivity and fill factor at these large thicknesses. Since the Ru(acac)$_3$ exciton blocking layer functionality is due to energy level alignment rather than metal deposition-induced damage, its thickness can be optimally designed to position the charge generating layers in the region of highest incident light intensity, thereby maximizing the power conversion efficiency in the characteristically thin organic layers used in organic solar cells while reducing the possibility of electrical shorts in large area devices.

Although the present invention is described with respect to particular examples and embodiments, it is understood that the present invention is not limited to these examples and embodiments. The present invention as claimed may therefore include variations from the particular examples and preferred embodiments described herein, as will be apparent to one of skill in the art.

What is claimed is:

1. A photosensitive cell comprising:
   an anode and a cathode;
   a donor-type organic material and an acceptor-type organic material forming a donor-acceptor junction connected between the anode and the cathode; and
   an exciton blocking layer connected between the acceptor-type organic material of the donor-acceptor junction and the cathode, the exciton blocking layer consisting essentially of a first material that has a hole mobility of at least 10$^{-7}$ cm$^2$/V-sec or higher,
   wherein a HOMO of the exciton blocking layer is higher than or equal to a HOMO of the acceptor-type organic material.

2. The photosensitive cell according to claim 1, wherein the hole mobility of the first material is at least 10$^{-6}$ cm$^2$/V-sec or higher.

3. The photosensitive cell according to claim 1, wherein a Fermi level of the cathode is no more than 1 eV higher than the HOMO of the exciton blocking layer.

4. The photosensitive cell according to claim 3, wherein the Fermi level of the cathode is not higher than the HOMO of the exciton blocking layer.

5. The photosensitive cell according to claim 1, wherein the HOMO of the exciton blocking layer is no more than 1 eV lower than a LUMO of the acceptor-type organic material.

6. The photosensitive cell according to claim 1, wherein the exciton blocking layer comprises tris(acetylacetonato)ruthenium(III).

7. The photosensitive cell according to claim 1, wherein the first material has the hole mobility of at least $10^{-7}$ cm$^2$/V-sec or higher in the absence of damage-mediated charge transport.

8. The photosensitive cell according to claim 7, wherein the first material has the hole mobility of at least $10^{-7}$ cm$^2$/V-sec or higher in the absence of dopants and impurities.

9. A photosensitive cell comprising:
an anode and a cathode;
a donor-type organic material and an acceptor-type organic material forming a donor-acceptor junction connected between the anode and the cathode; and
an exciton blocking layer connected between the acceptor-type organic material of the donor-acceptor junction and the cathode, wherein a Fermi level of the cathode is no more than 1 eV higher than a HOMO of the exciton blocking layer.

10. The photosensitive cell according to claim 9, wherein the Fermi level of the cathode is not higher than the HOMO of the exciton blocking layer.

11. The photosensitive cell according to claim 9, wherein the HOMO of the exciton blocking layer is higher than or equal to a HOMO of the acceptor-type organic material.

12. The photosensitive cell according to claim 9, wherein the HOMO of the exciton blocking layer is no more than 1 eV lower than a LUMO of the acceptor-type organic material.

13. The photosensitive cell according to claim 9, wherein the exciton blocking layer comprises tris(acetylacetonato)ruthenium(III).

14. The photosensitive cell according to claim 9, the blocking layer consisting essentially of a first material that has a hole mobility of at least $10^{-7}$ cm$^2$/V-sec or higher.

15. The photosensitive cell according to claim 14, wherein the hole mobility of the first material is at least $10^{-6}$ cm$^2$/V-sec or higher.

16. The photosensitive cell according to claim 14, wherein the first material has the hole mobility of at least $10^{-7}$ cm$^2$/V-sec or higher in the absence of damage-mediated charge transport.

17. The photosensitive cell according to claim 16, wherein the first material has the hole mobility of at least $10^{-7}$ cm$^2$/V-sec or higher in the absence of dopants and impurities.

* * * * *

UNITED STATES PATENT AND TRADEMARK OFFICE
CERTIFICATE OF CORRECTION

| | | |
|---|---|---|
| PATENT NO. | : 7,230,269 B2 | Page 1 of 1 |
| APPLICATION NO. | : 11/150143 | |
| DATED | : June 12, 2007 | |
| INVENTOR(S) | : Barry P. Rand, Stephen R. Forrest and Mark E. Thompson | |

It is certified that error appears in the above-identified patent and that said Letters Patent is hereby corrected as shown below:

Column 1, lines 14-22, please replace the paragraph under the heading "Joint Research Agreement" and replace with:

The claimed invention was made by, on behalf of, and/or in connection with one or more of the following parties to a joint university-corporation research agreement(s): Princeton University, The University of Southern California and Global Photonic Energy Corporation and/or Universal Display Corporation. The agreement(s) was in effect on and before the date the claimed invention was made, and the claimed invention was made as a result of activities undertaken within the scope of the agreement(s).

Signed and Sealed this

Seventeenth Day of March, 2009

JOHN DOLL
*Acting Director of the United States Patent and Trademark Office*